United States Patent
Cheng (10) Patent No.: US 6,343,707 B2
(45) Date of Patent: Feb. 5, 2002

(54) MEMORY CARD CASING

(76) Inventor: Tsung-Kan Cheng, 13Fl., No.105, Lane 103, Sec. 2, Nei Hu Road, Taipei (TW)

(*) Notice: Subject to any disclaimer, the term of this patent is extended or adjusted under 35 U.S.C. 154(b) by 0 days.

(21) Appl. No.: 09/836,122

(22) Filed: Apr. 16, 2001

(51) Int. Cl.$^7$ .............................. B65D 85/00; B65D 6/28
(52) U.S. Cl. ........................ 220/4.24; 206/706; 206/724
(58) Field of Search ............................... 220/4.24, 4.21, 220/4.02; 206/706, 710, 723, 724

(56) References Cited

U.S. PATENT DOCUMENTS

| | | | | |
|---|---|---|---|---|
| 4,664,254 A | * | 5/1987 | Sitwell et al. | 220/4.24 |
| 5,111,302 A | * | 5/1992 | Flamm et al. | 220/4.24 |
| 5,369,549 A | * | 11/1994 | Kopp et al. | 220/4.24 |
| 5,526,929 A | * | 6/1996 | Wei | 220/4.24 |
| 5,848,702 A | * | 12/1998 | Pakgriasamy | 220/4.24 |
| 5,871,116 A | * | 2/1999 | Picchietti | 220/4.24 |

* cited by examiner

Primary Examiner—Joseph M. Moy
(74) Attorney, Agent, or Firm—Pro-Techtor Inter-National Services (57) ABSTRACT

A memory card casing includes a plastic framework, and upper and lower metal covers that could be conveniently assembled to two sides of the plastic framework. The metal covers are fastened to each other via fastening means spaced on perpendicular wall portions of the metal covers. Each of the fastening means includes first and second fastening plates. The plastic framework is provided with retaining means, each of which includes a neck portion inward projected from and perpendicular to inner wall surface of the plastic framework and an expanded head portion in front of the neck portion. When the two metal covers are closed onto two sides of the plastic framework, the second fastening plates are located in recesses defined by the first fastening plates with tongues provided on the first fastening plates extended through retaining holes defined by the second fastening plates to firmly hold the two fastening plates together, and the neck portions are confined in holes defined by spaces on the wall portions of the metal covers between any two adjacent fastening plates to prevent the expanded head portions and, accordingly, the whole plastic framework from separating from the closed metal covers.

7 Claims, 7 Drawing Sheets

MEMORY CARD CASING

FIELD OF THE INVENTION

The present invention relates to a memory card casing that includes metal covers adapted to be easily and firmly assembled to two sides of a plastic framework that holds a circuit board thereto.

BACKGROUND OF THE INVENTION

A memory card typically includes a flat framework made of plastic material for holding a circuit board and the circuit elements thereof. For the memory card to be thin and rigid as required, metal covers are further mounted onto upper and lower surfaces of the plastic framework. That is, the plastic framework and the two metal covers together form a casing of a general memory card.

Currently, there are generally two ways to combine the metal covers with the plastic framework. In the first way, the plastic framework is applied at two sides with glue to bond the very thin metal covers thereto. In the second way, the very thin metal covers formed through punching are put into a mold in a plastic injecting machine, so that each metal cover is coated at outer edges with injected plastic material to form a half frame ready for supersonic machining.

By superposing two opposed half frames of the metal covers and combining them together through supersonic welding, a memory card casing is formed.

Either the first or the second way of forming a memory card casing necessitates the use of a bonding machine or supersonic-welding machine and therefore requires higher manufacturing cost. Moreover, considerable time is needed to complete the mechanical assembling of the memory card casing and the production efficiency thereof is therefore low.

SUMMARY OF THE INVENTION

It is a primary object of the present invention to provide a novel memory card casing including components that could be easily and quickly assembled without using any machine.

In an aspect of the present invention, the memory card casing includes a plastic framework, and an upper and a lower metal cover adapted to respectively press onto upper and lower sides of the plastic framework. The upper and the lower metal covers are correspondingly provided along more than one edge with upper and lower wall portions, respectively, that perpendicularly extend toward each other. A plurality of spaced fastening means, each including a first fastening plate and a second fastening plate, are provided on the upper and the lower wall portions. Each of the first fastening plates defines a tongue and each of the second fastening plates defines a retaining hole. A space is defined between any two adjacent fastening means on the upper and the lower wall portions, such that a pair of two vertically corresponded spaces together form a closed hole when the upper and the lower metal covers are closed onto two sides of the plastic framework. The plastic framework is adapted to enclose the three edges of the upper and the lower metal covers provided with the wall portions. The plastic framework is provided on inner wall surfaces with spaced retaining means corresponding to the spaces at where the closed holes are to be formed. Each of the retaining means includes a narrowed neck portion perpendicularly projected from the inner wall surface of the plastic framework and an expanded head portion integrally connected to a front of the neck portion. Whereby when the upper and the lower metal covers are assembled to the plastic framework by pressing them onto upper and lower sides of the plastic framework, the first fastening plates and the second fastening plates of the fastening means firmly couple with one another with the tongues extended through the retaining holes, and the neck portions of the retaining means on the plastic framework are confined in the closed holes formed from the spaces on the upper and the lower metal covers, causing the plastic framework and the upper and the lower metal covers to firmly connect to one another and form a unit.

In another aspect of the present invention, the first fastening plate of each fastening means defines a holed inward recess and a tongue upward and outward extended from the inward recess, and the second fastening plate defines a retaining hole therein. When the upper and the lower metal covers are closed onto each other, the second fastening plates are located in the inward recesses of the first fastening plates with the tongues extended through the retaining holes to hold the second fastening plates to the first fastening plates and thereby prevent the upper metal cover from separating from or moving sideward relative to the lower metal cover.

In a further aspect of the present invention, the first fastening plate of each fastening means defines a holed inward recess, and the second fastening plate defines a downward extended tongue. When the upper and the lower metal covers are closed onto each other, the second fastening plates are located in the inward recesses of the first fastening plates with the tongues extended through the holed inward recesses to hold the second fastening plates to the first fastening plates and thereby prevent the upper metal cover from separating from or moving sideward relative to the lower metal cover.

In a still further aspect of the present invention, the upper or the lower wall portion that has the second fastening plate spaced thereon is provided with stoppers preferably close to the second fastening plates. The stoppers are so shaped that they perpendicularly extend from the upper or the lower wall portion to fitly abut on an inner wall surface of the lower or the upper wall portion opposite to them when the upper and the lower metal covers are closed to each other. Whereby the stoppers are adapted to work with the tongues of the first fastening plates on the opposite wall portion to produce an outward and an inward force, respectively, to restrict the upper metal cover from moving inward or outward relative to the lower metal covers.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
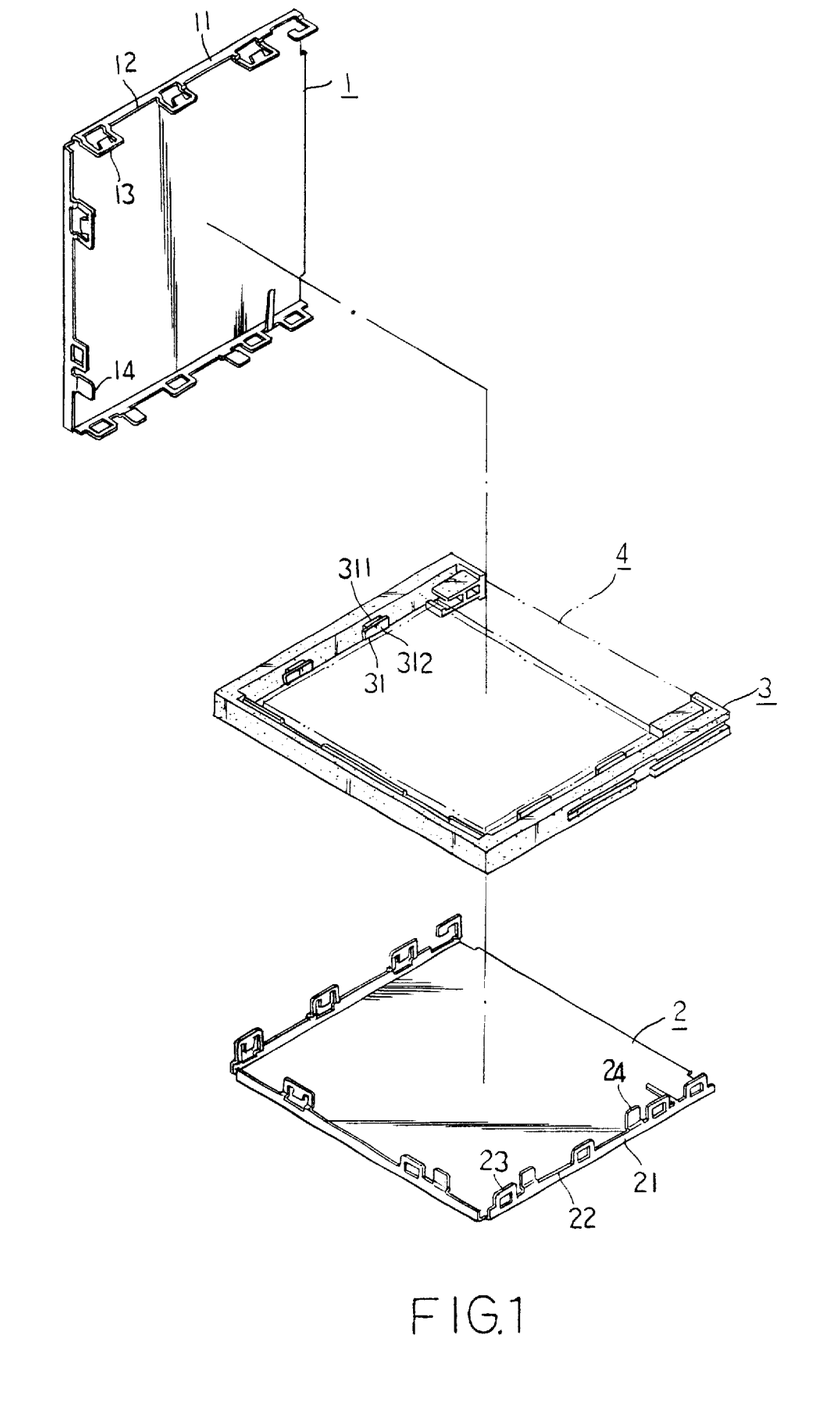
FIG. 1 is an exploded perspective of a memory card casing according to a preferred embodiment of the present invention.
Figure 2:
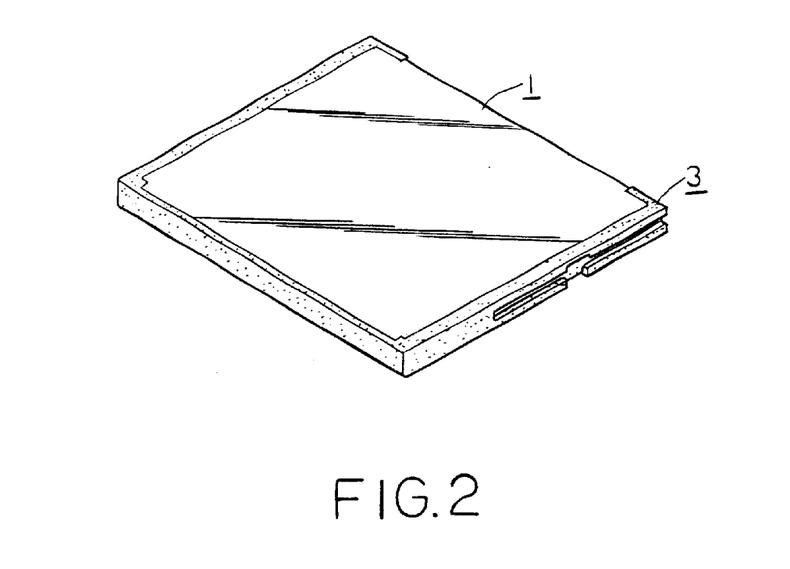
FIG. 2 is an assembled perspective of the memory card casing of FIG. 1.

Please refer to FIG. 1 that is an exploded perspective of a memory card casing according to a preferred embodiment of the present invention. As shown, the memory card casing mainly includes an upper metal cover 1, a lower metal cover 2, and a plastic framework 3 onto which a circuit board 4 having predetermined circuit elements is mounted before the upper and the lower metal covers 1, 2 are assembled to the plastic framework 3.

Figure 3:
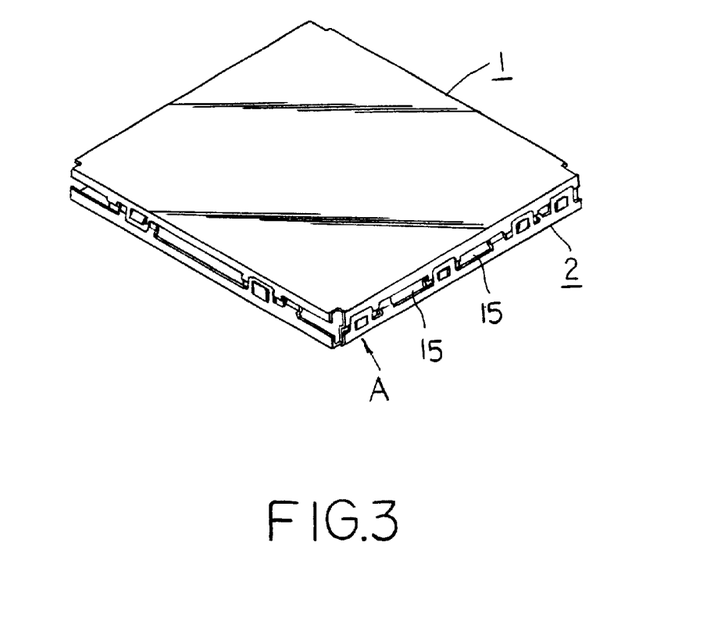
FIG. 3 is an assembled perspective of the memory card casing of FIG. 1 with the plastic framework removed therefrom to better show the connection of the upper metal cover to the lower metal cover.
Figure 4:
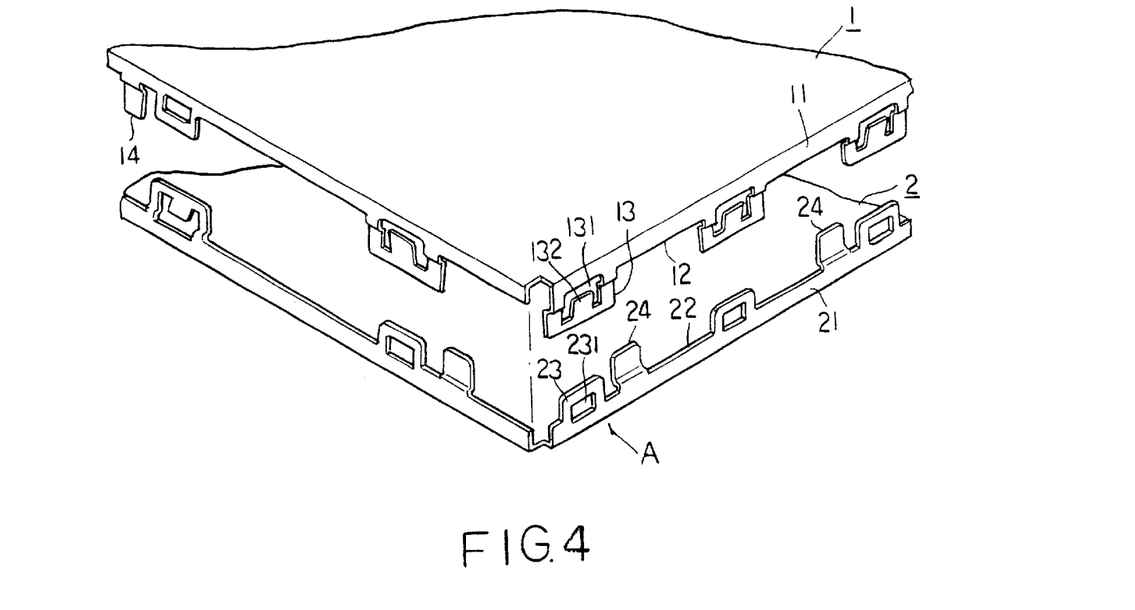
FIG. 4 is a fragmentary and enlarged exploded perspective of the upper and the lower metal covers forming the memory card casing of FIG. 1.
Figure 5:
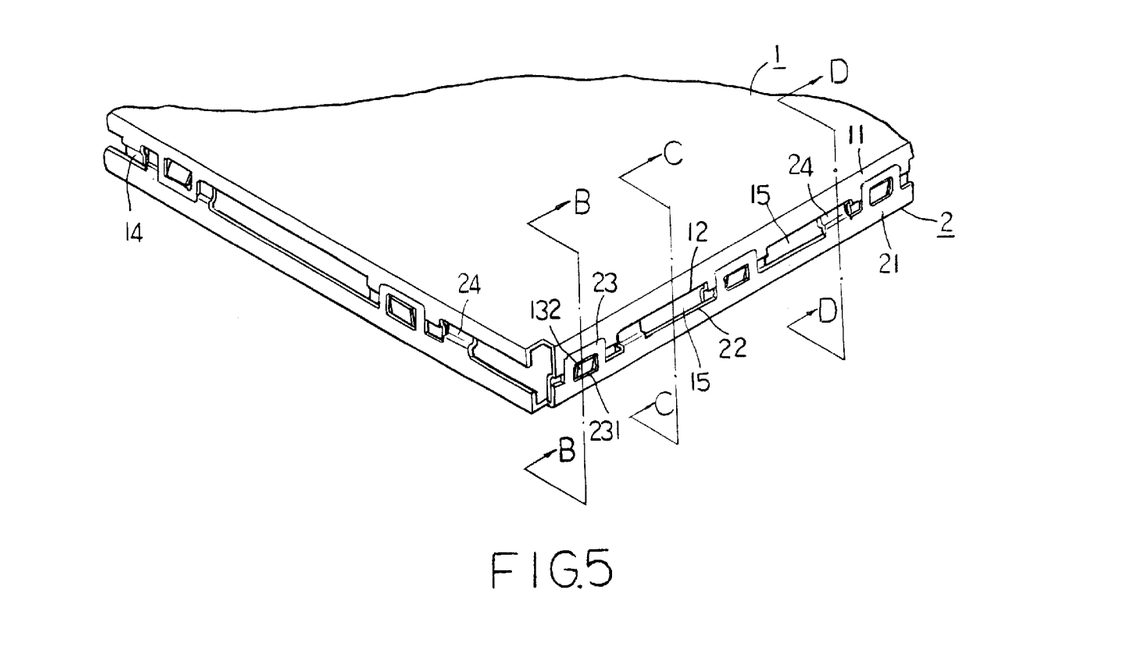
FIG. 5 is an assembled view of FIG. 4.

The upper and the lower metal covers 1, 2 are respectively provided along more than one edge (three are shown in the illustrated drawings) with perpendicular upper wall portion 11 and lower wall portion 21 that extend inward toward each other. The covers 1, 2 both have at least one edge not provided with inward wall portions so that a connection element (not shown) of the circuit board 4 could be located thereat. A plurality of spaced first fastening plates 13 downward project from the upper wall portion 11, and a plurality of spaced second fastening plates 23 upward project from the lower wall portion 21 corresponding to the first fastening plates 13. Each pair of corresponded first fastening plate 13 and second fastening plate 23 together form a fastening means (A), a structure of which would be described in more details later. Please note that it is also possible to provide the first fastening plates 13 on the lower wall portion 21 and the second fastening plates 23 on the upper wall portion 11. A space 12, 22 is defined between any two adjacent fastening means (A) on the upper and the lower wall portions 11, 21, such that a pair of vertically corresponded spaces 12 and 22 together form a closed hole 15 when the upper and the lower metal covers 1, 2 are closed to each other (see FIG. 3).

Figure 7:
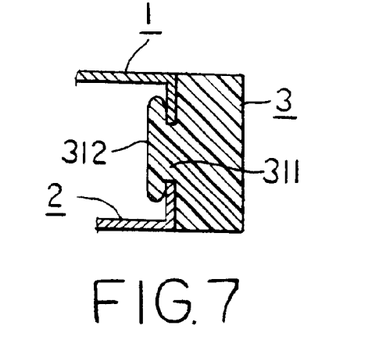
FIG. 7 is a sectional view taken on line C—C of FIG. 5.

The plastic framework 3 is provided on inner wall surfaces with spaced retaining means 31 corresponding to the spaces 12, 22 at where the closed holes 15 are to be formed. Each of the retaining means 31 includes a narrowed neck portion 311 perpendicularly projected from the inner wall surface of the plastic framework 3 and an expanded head portion 312 integrally connected to a front of the neck portion 311, as can be clearly seen in FIG. 7.

Figure 6A:
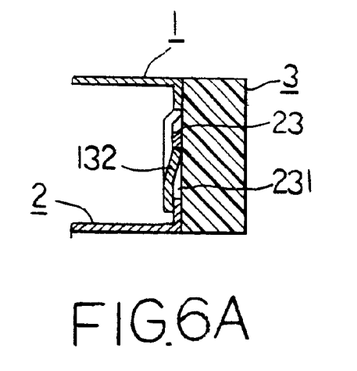
FIG. 6A is a sectional view taken on line B—B of FIG. 5.
Figure 6B:
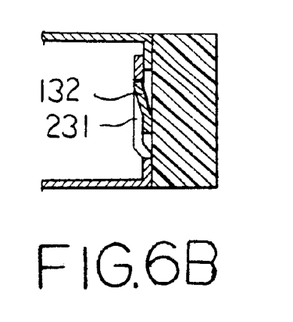
FIG. 6B is a sectional view similar to FIG. 6A but showing another embodiment of the connection of the upper metal cover to the lower metal cover.

The following description is made on the basis of providing the first fastening plates 13 on the upper wall portion 11 and the second fastening plates 23 on the lower wall portion 21. Please now refer to FIGS. 1 to 6 in which a first embodiment of the fastening means (A) is shown. In this first embodiment, each of the first fastening plates 13 defines a holed inward recess 131 and a tongue 132 located in the holed inward recess 131 to upward project therefrom. Each of the second fastening plates 23 defines a retaining hole 231 therein. As can be seen from FIG. 6A, the tongue 132 is slightly inclined outward to extend through the retaining hole 231. In another embodiment of the present invention, the first fastening plate 13 is a straight plate with an upward and inward inclined tongue 132, and the second fastening plate 23 defines an inward recess having a retaining hole 231 through which the tongue 132 extends to couple the two fastening plates 13, 23. FIG. 6B shows the connection of the first fastening plate 13 to the second fastening plate 23 in this embodiment.

The upper and the lower metal cover 1, 2 are assembled to the plastic framework 3 by pressing them onto upper and lower sides of the plastic framework 3, respectively. At this point, the tongues 132 on the upper metal cover 1 extend through the retaining holes 231 on the lower metal cover 2 while the second fastening plates 23 are located in the inward recesses 131 defined by the first fastening plates 13. The location of the second fastening plates 23 in the inward recesses 131 prevents the second fastening plates 23 from moving sideward relative to the first fastening plate 13 and therefore ensures firm connection of the upper metal cover 1 to the lower metal cover 2 without the risk of sideward dislocation of the two covers 1, 2 relative to each other. When the upper and the lower covers 1, 2 are connected to each other in the above-described manner, the vertically corresponded spaces 12, 22 between any two adjacent fastening means (A) are also aligned with each other to form the closed holes 15 with the neck portions 311 of the retaining means 31 on the plastic framework 3 being confined in the closed holes 15 and the head portions 312 projected into the wall portions 11, 21 of the upper and the lower metal covers 1, 2. As a result, the plastic framework 3 is firmly associated with the upper and the lower metal covers 1, 2 that are connected to each other with the fastening means (A).

Figure 8:
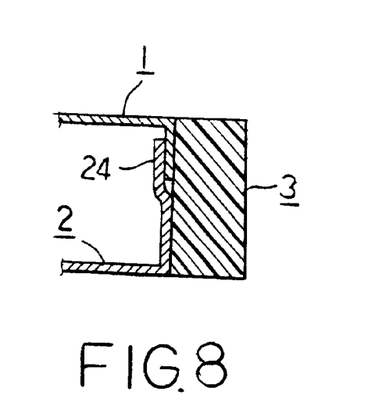
FIG. 8 is a sectional view taken on line D—D of FIG. 5.

There are also stoppers 14, 24 downward and upward extended from the upper and the lower wall portions 11, 21, respectively, preferably at positions close to the second fastening plates 23. Please refer to FIG. 8, the stoppers 14, 24 are so shaped that they extend into and abut against inner surfaces of the wall portions 21 and 11, respectively, when the two metal covers 1, 2 are closed to each other. The stoppers 14, 24 and the tongues 132 respectively produce outward and inward forces to prevent the upper metal cover 1 from moving inward or outward relative to the lower metal cover 2 when the memory card casing is adversely deflected. And, since the second fastening plates 23 are located in the inward recesses 131 with the tongues 132 extended through the retaining holes 231, the lower covers 2 is prevented from sideward moving relative to the upper metal cover 1 when the whole memory card casing of the present invention is adversely deflected.

Moreover, the neck portion 311 of the retaining means 31 on the plastic framework 3 each has a height equal to that of the closed hole 15 for the neck portion 311 to tightly abut against the wall portions 11, 21 above and below the closed hole 15. That is, there is not any clearance left between the neck portions 311 and the upper and the lower wall portions 11, 21 when the two metal covers 1, 2 are closed onto two sides of the plastic framework 3. Therefore, the plastic framework 3 would not vertically or horizontally move relative to the metal covers 1, 2 when the memory card casing of the present invention is adversely deflected.

With the above arrangements, once the upper and the lower metal covers 1, 2 are pressed onto upper and lower sides of the plastic framework 3, the fastening means (A), the stoppers 14, 24, and the retaining means 31 automatically work together to firmly hold the three components 1, 2, and 3 in one unit without the risk of becoming loosened from one another. The memory card casing of the present invention can therefore be very conveniently and firmly assembled.

Figure 9:
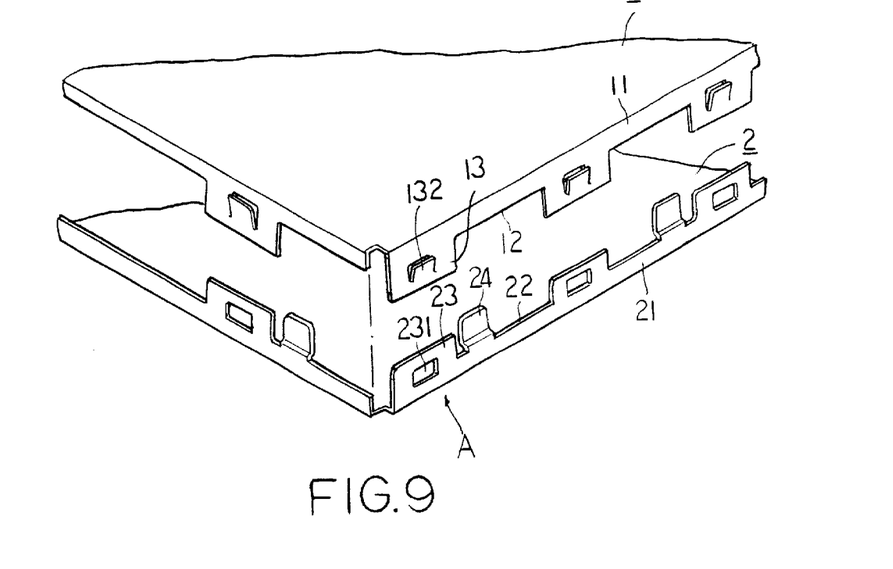
FIG. 9 is a fragmentary and enlarged exploded perspective of an upper and a lower metal covers having fastening means according to another embodiment of the present invention.
Figure 10:
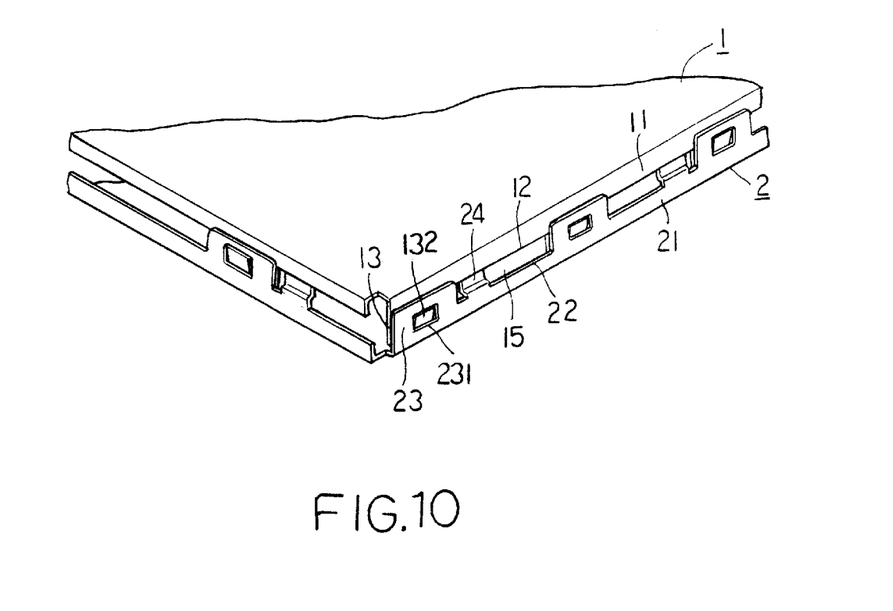
FIG. 10 is an assembled perspective of FIG. 9.

FIGS. 9 and 10 are exploded and assembled perspective views of two metal covers 1, 2 according to another embodiment of the present invention. In this embodiment, the lower wall portion 21 is fitly located outside the upper wall portion 11 when the two metal covers 1, 2 are closed onto each other, and the fastening means (A) are each includes a first fastening plate downward extended from the upper wall portion 11 and a second fastening plate upward extended from the lower wall portion 21. The first fastening plate each has an upward extended and slightly outward inclined tongue 132 and the second fastening plate defines a retaining hole 231. When the two metal covers 1, 2 are closed onto each other, the second fastening plates are located at outer side of the first fastening plates with the tongues 132 outward extended through the retaining holes 231 to firmly hold the two metal covers together.

Figure 11:
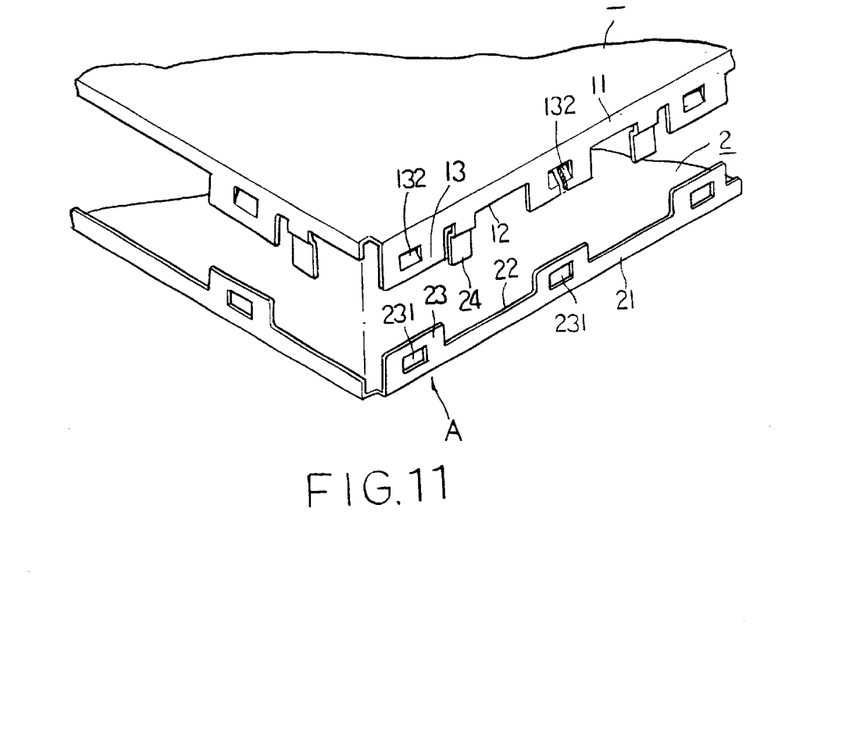
FIG. 11 is a fragmentary and enlarged exploded perspective of an upper and a lower metal covers having fastening means according to a further embodiment of the present invention.
Figure 12:
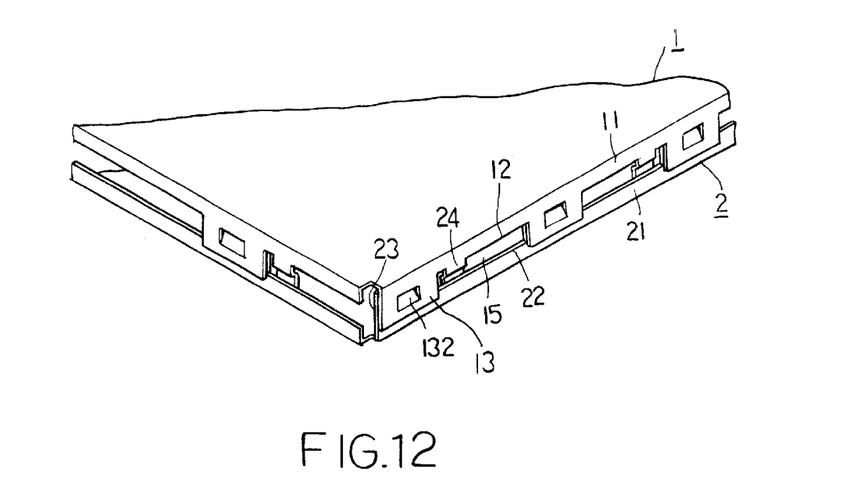
FIG. 12 is an assembled perspective of FIG. 11.

FIGS. 11 and 12 are exploded and assembled perspective views of two metal covers 1, 2 according to a further embodiment of the present invention. This embodiment is similar to the above embodiment shown in FIGS. 9 and 10, except that the first fastening plate each has an upward extended and slightly inward inclined tongue 132, so that when the two metal covers 1, 2 are closed onto each other, the second fastening plates are located at inner side of the first fastening plates with the tongues 132 inward extended through the retaining hole 231 to firmly hold the two metal covers together.

Figure 13:
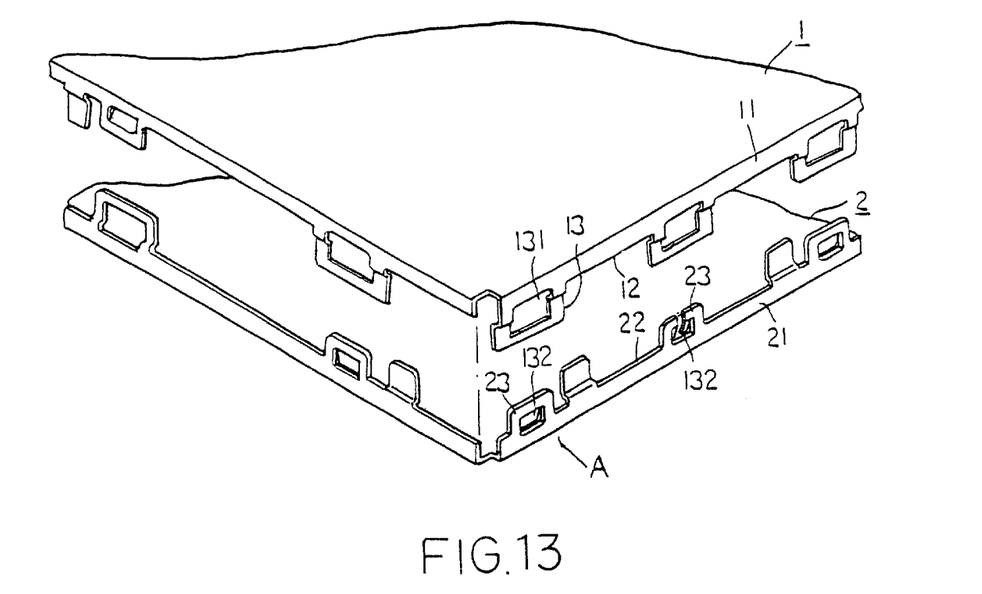
FIG. 13 is a fragmentary and enlarged exploded perspective of an upper and a lower metal covers having fastening means according to a still further embodiment of the present invention.
Figure 14:
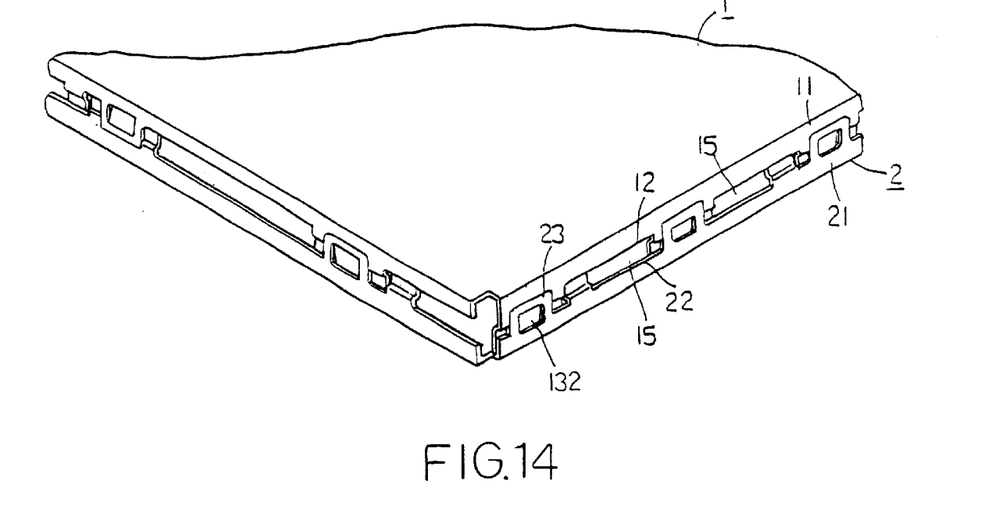
FIG. 14 is an assembled perspective of FIG. 13.

FIGS. 13 and 14 are exploded and assembled perspective views of two metal covers 1, 2 according to a still further embodiment of the present invention. In this embodiment, each of the first fastening plates 13 defines a holed inward recess 131, and each of the second fastening plates 23 defines a downward extended tongue 231, such that the tongues 231 on the lower metal cover 1 extend through the holed inward recesses 131 on the upper metal cover 2 while the second fastening plates 23 are located in the inward recesses 131 defined by the first fastening plates 13. The location of the second fastening plates 23 in the inward recesses 131 prevents the second fastening plates 23 from moving sideward relative to the first fastening plate 13 and therefore ensures firm connection of the upper metal cover 1 to the lower metal cover 2 without the risk of sideward dislocation of the two covers 1, 2 relative to each other.

Please note it is also possible for the above embodiments shown in FIGS. 9 to 14 to provide the first fastening plates on the lower metal cover 2 and the second fastening plates on the upper metal cover 1.

What is claimed is:

1. A memory card casing comprising a plastic framework, and an upper and a lower metal cover adapted to respectively press onto upper and lower sides of said plastic framework; said upper and said lower metal covers being correspondingly provided along more than one edge with perpendicular upper and lower wall portions, respectively, that extend toward each other; a plurality of spaced fastening means, each including a first fastening plate and a second fastening plate, being provided on said upper and said lower wall portions; a space being defined between any two adjacent fastening means on said upper and said lower wall portions, such that a pair of two vertically corresponded spaces together form a closed hole when said upper and said lower metal covers are closed onto two sides of said plastic framework; and said plastic framework being adapted to enclose said edges of said upper and said lower metal covers provided with said wall portions, said plastic framework being provided on inner wall surfaces with spaced retaining means corresponding to said spaces on said wall portions at where said closed holes are to be formed, each of said retaining means including a narrowed neck portion perpendicularly projected from said inner wall surface of said plastic framework and an expanded head portion integrally connected to a front of said neck portion; whereby when said upper and said lower metal covers are assembled to said plastic framework by pressing them onto upper and lower sides of said plastic framework, said first fastening plates and said second fastening plates of said fastening means firmly couple with one another, and said neck portions of said retaining means on said plastic framework are confined in said closed holes formed from said spaces on said wall portions of said upper and said lower metal covers, causing said plastic framework, and said upper and said lower metal covers to firmly connect to one another and form a unit.

2. The memory card casing as claimed in claim 1, wherein said first fastening plate of each said fastening means defines a tongue, and said second fastening plate defines a retaining hole; when said upper and said lower metal covers are closed onto each other, said second fastening plate is located at side of said first fastening plate with said tongue extended through said retaining hole 231 to firmly hold said upper and said lower metal covers together.

3. The memory card casing as claimed in claim 1, wherein said first fastening plate of each said fastening means defines a holed inward recess and a tongue located in said inward recess and upward projected therefrom, and said second fastening plate defining a retaining hole therein; and said second fastening plate being adapted to locate in said inward recess of said first fastening plate with said tongue extended through said retaining hole when said upper and said lower metal covers are closed onto each other and thereby preventing said lower metal cover from moving sideward relative to said first metal cover.

4. The memory card casing as claimed in claim 1, wherein said first fastening plate of each said fastening means defines a holed inward recess, and said second fastening plate defining a downward extended tongue; and said second fastening plate being adapted to locate in said holed inward recess of said first fastening plate with said tongue extended through said holed inward recess when said upper and said lower metal covers are closed onto each other and thereby preventing said lower metal cover from moving sideward relative to said first metal cover.

5. The memory card casing as claimed in claim 2, wherein either said upper or said lower wall portion that has said second fastening plate spaced thereon is provided with stoppers preferably close to said second fastening plates, and said stoppers being so shaped that they extend from said upper or said lower wall portion to fitly abut on an inner wall surface of said lower or said upper wall portion opposite to them when said upper and said lower metal covers are closed onto each other, whereby said stoppers are adapted to work with said tongues of said first fastening plates on said opposite wall portion to produce an outward and an inward force, respectively, to restrict said upper metal cover from moving inward or outward relative to said lower metal covers.

6. The memory card casing as claimed in claim 3, wherein either said upper or said lower wall portion that has said second fastening plate spaced thereon is provided with stoppers preferably close to said second fastening plates, and said stoppers being so shaped that they extend from said upper or said lower wall portion to fitly abut on an inner wall surface of said lower or said upper wall portion opposite to them when said upper and said lower metal covers are closed onto each other, whereby said stoppers are adapted to work with said tongues of said first fastening plates on said opposite wall portion is to produce an outward and an inward force, respectively, to restrict said upper metal cover from moving inward or outward relative to said lower metal covers.

7. The memory card casing as claimed in claim 4, wherein either said upper or said lower wall portion that has said second fastening plate spaced thereon is provided with stoppers preferably close to said second fastening plates, and said stoppers being so shaped that they extend from said upper or said lower wall portion to fitly abut on an inner wall surface of said lower or said upper wall portion opposite to them when said upper and said lower metal covers are closed onto each other, whereby said stoppers are adapted to work with said tongues of said first fastening plates on said opposite wall portion to produce an outward and an inward force, respectively, to restrict said upper metal cover from moving inward or outward relative to said lower metal covers.

* * * * *